(12) United States Patent
Olofsson et al.

(10) Patent No.: US 6,501,159 B2
(45) Date of Patent: *Dec. 31, 2002

(54) POWER TRANSISTOR MODULE, POWER AMPLIFIER AND METHOD IN THE FABRICATION THEREOF

(75) Inventors: Lars-Anders Olofsson, Järfälla (SE); Bengt Ahl, Gävle (SE)

(73) Assignee: Telefonaktiebolaget L M Ericsson, Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 09/735,533

(22) Filed: Dec. 14, 2000

(65) Prior Publication Data

US 2001/0004115 A1 Jun. 21, 2001

(30) Foreign Application Priority Data

Dec. 15, 1999 (SE) ................................................ 9904594

(51) Int. Cl.[7] .............................................. H01L 23/495
(52) U.S. Cl. ......................... 257/673; 257/675; 257/676
(58) Field of Search .................................. 257/673–676

(56) References Cited

U.S. PATENT DOCUMENTS

| | | | | |
|---|---|---|---|---|
| 5,438,305 A | * | 8/1995 | Hikita et al. ................ | 174/52.1 |
| 5,633,209 A | | 5/1997 | Leedy ..................... | 435/228 H |
| 5,901,042 A | | 5/1999 | Ota et al. .................... | 361/704 |
| 6,201,701 B1 | * | 3/2001 | Linden et al. .............. | 174/252 |
| 2001/0038310 A1 | * | 11/2001 | Olofsson et al. ............ | 330/250 |

FOREIGN PATENT DOCUMENTS

| | | | | |
|---|---|---|---|---|
| DE | 39 40 388 C2 | * | 7/1993 | ......... H01L/29/784 |
| EP | 527 468 | | 2/1993 | |
| GB | 2 042 802 | | 9/1980 | |
| WO | WO99/40627 | | 8/1999 | |

* cited by examiner

*Primary Examiner*—Allan R. Wilson
(74) *Attorney, Agent, or Firm*—Burns, Doane, Swecker & Mathis, L.L.P.

(57) ABSTRACT

The present invention relates to a power transistor module for radio frequency applications, particularly for use in an amplifier stage in a radio base station or in a ground transmitter for TV or radio, wherein said power transistor module comprises a support plate, a power transistor chip arranged thereon, outer electrical connections projecting from the module for external connection and inner electrical connections connected between said transistor chip and said outer connections, at least one of said inner electrical connections comprising a first conductor pattern arranged on a flexible foil. The invention further comprises a power amplifier comprising said module, a method in the fabrication of said module, a method in the fabrication of a power amplifier, where said module is electrically connected to a circuit board mounted at a heat sink and to be mounted at said heat sink, and finally to a power amplifier manufactured according to the method.

28 Claims, 6 Drawing Sheets

Fig. 8
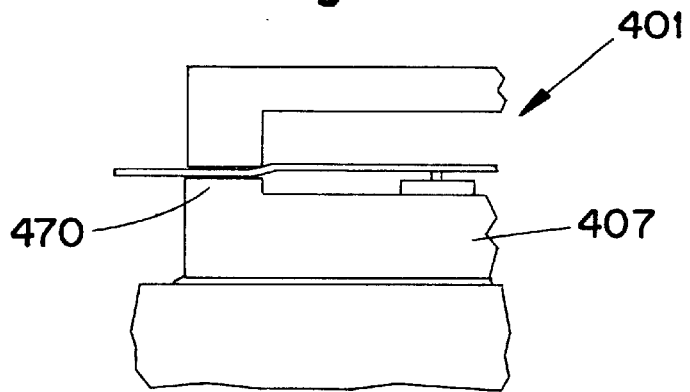
Fig. 9
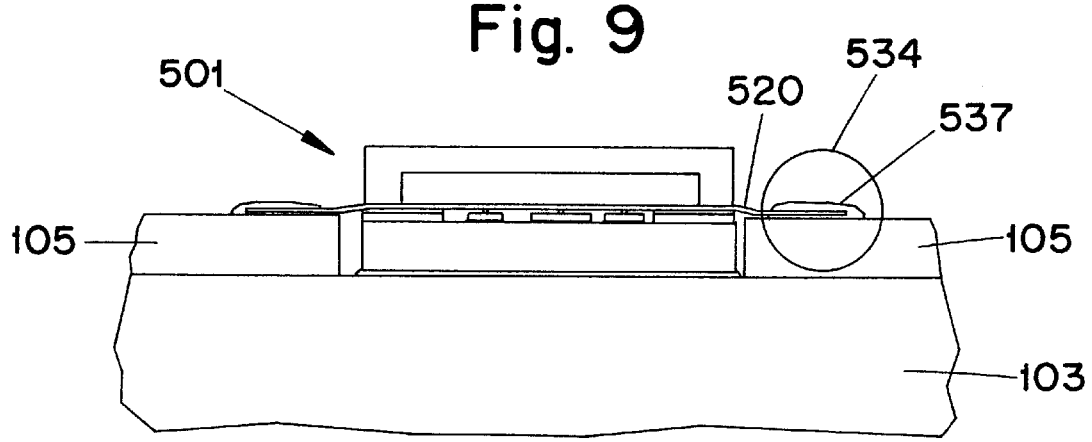
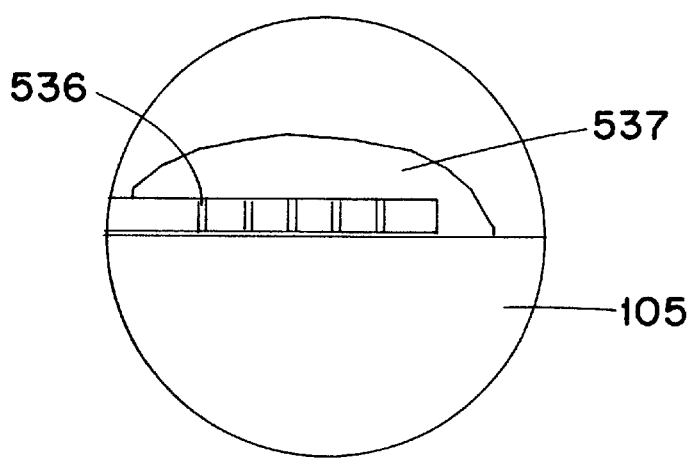
Fig. 10

POWER TRANSISTOR MODULE, POWER AMPLIFIER AND METHOD IN THE FABRICATION THEREOF

TECHNICAL FIELD

The present invention relates to a power transistor module intended for radio frequency applications, particularly for use in an amplifier stage in a radio base station or in a ground transmitter for television or radio, to a power amplifier comprising said power transistor module and methods in the fabrication of the power transistor module and the power amplifier.

DESCRIPTION OF RELATED ART AND BACKGROUND OF THE INVENTION

Power transistor modules for amplification at high frequencies have to comply with a number of detailed requirements as regards power amplification, ruggedness, breakdown voltages, noise, distortion, capacitances, input and output impedances, etc. at a specified feed voltage and operation frequency. The demands on output power vary from a few watts to several hundred watts, in the latter case several components connected in parallel in a module being utilized. Power transistors operate at high signal levels and thus high current densities. The operation frequency is within the radio and microwave frequencies.

The power transistor modules are the critical components in power amplifiers in radio transmitters. The performance of the modules is the limiting factor as regards output power, efficiency and reliability.

In FIG. 1 is shown, schematically in cross-section, a power transistor module 1 mounted at a heat sink 3 and electrically connected to conductor pattern (not shown) on a circuit board or a printed circuit board 5 according to known practice, see e.g. U.S. Pat. No. 5,901,042 and references therein.

Module 1 comprises a rectangular electrically conducting and heat conducting bottom plate or flange 7, preferably of a metallic material, onto the upper surface of which are mounted a transistor chip 9 and typically a first 11 and a second 13 capacitor chip. Further, module 1 comprises an insulating, preferably ceramic, frame arrangement or isolator 15 mounted on the upper surface of flange 7 so that the arrangement surrounds said chips, and a cover 17 attached to frame 15.

The transistor chip 9 is typically a chip of the LDMOS (Lateral Double Diffused Metal Oxide) type and comprises a row of blocks connected in parallel, which each comprises a large number of transistor cells connected in parallel. The higher output power that is desired, the more transistor cells are needed. In FIG. 2 is shown a schematic layout of the transistor chip 9 comprising seven blocks. In each block all gates are connected in parallel to a gate connection or pad and all drains are connected to a drain connection or pad. In the uppermost block the gate pad is indicated by 19 and the drain pad is indicated by 21. The sources have connections at the back side/bottom side of the chip, which are connected to ground, e.g. via flange 7.

High power transistors have at high frequencies very low input and output impedances. To match these to surrounding circuits on the circuit board 5 impedance matching networks are needed close to the active chip with the transistors. Usually, these matching circuits are implemented by using bonding wires 23, 25, 27, 29 and capacitor chips 11, 13 inside the power transistor module 1. The bonding wires are further connected to straight butt connection contacts 31, 33, preferably of alloy 42, which are projecting from module 1 for connection to said surrounding circuits. In FIG. 2 bonding wires 25, 27 are indicated at the uppermost block of the chip. Each other block is certainly connected via its own bonding wires (not shown). Difficulties to attain tight tolerances during manufacture of the modules give rise to undesired variations in different critical electrical parameters.

The module 1 may be fastened to heat sink 3 by screws or bolts, whereafter the butt connection contacts 31, 33 are manually soldered to the surrounding circuits of circuit board 5 through soldered seams 35, 37. Flange 7 and heat sink 3 typically comprise apertures or recesses for receiving screws or bolts (not shown) for the mounting of module 1.

The matching network gives an extra contribution to the impedances before an outer impedance matching is performed on the circuit board. The placement of the transistor chip in the module is very critical, since it affects the length and form of the bonding wires and thereby the impedance matching. Length and form of the bonding wires may be difficult to define.

The low output impedance of the transistor chip is caused by the capacitance of the transistor chip together with a relatively low feeding voltage. The possibilities to achieve a good matching to the surrounding circuits are limited by these facts and by inductance in the conductors (particularly the bonding wires) between the power transistor module and the circuit board.

The impedance matching, which is required, therefore has to be performed both inside the power transistor module and outside on the circuit board. Variations in the properties of the transistor module, in the dimensions of the circuit boards and in the placement of the components will imply that a power amplifier comprising said components ought to be functionally trimmed to possess the best performance. Tolerance equalization through trimming, however, is not desirable by amplifier manufacturers. Manufacture without trimming will, however,-rarely provide for optimal performance but results is discarding of transistor modules.

Further, high power transistor modules of the above kind cannot be surface soldered (i.e. machine soldered) together with other surface soldered circuits on the circuit board and thereafter be mounted, i.e. fastened by screws, to a heat sink, since the modules are mechanically stressed during the screwing. The force arisen hereby is directly transferred to the soldered seams through the butt connector contacts, such that the soldered seams will be damaged, e.g. they will crack. This involves that the transistors have to be soldered manually as indicated, which is time-consuming, costly and results in large quality variations.

Due to the straight butt connector contacts, which are very rigid, the movements, which arise due to the temperature variations, will direct affect the soldered seams between the module and the circuit board. During these stresses the solder will plasticize and relax, which results in congruence displacements. When this is repeated sufficiently many times the soldered seams start to crack, which constitutes the main source of failure during operation. The lifetime of an amplifier will in this case be 5–10 years instead of the desired 30 years. Existing capsules for transistors have preferably a metallic flange and a ceramic isolator. Both the flange and the isolator must have a certain thickness due to purely mechanical reasons and the transistor module will therefore be thicker than the circuit board (which normally is 0.8 mm).

A recess must therefore be milled in the heat sink in order to be able to lower the flange of the transistor module, see FIG. 1. This involves increased manufacturing expenditures and a risk for irregularities in the bottom of the recesses. Such an irregular mounting surface results in a risk that the capsules are bent during the fastening by screws, so that the chips crack. Further, the cooling is deteriorated.

SUMMARY OF THE INVENTION

It is an object of the present invention to provide a power transistor module intended for radio frequency applications, particularly for use in an amplifier stage in a radio base station, which is lacking at least some of the problems which are associated with prior art.

It is in this respect a particular object of the present invention to provide a power transistor module, which reduces the problems of high inductance and high resistance and of large parameter variations, which are associated with wire bonding.

It is a further object of the invention to provide a power transistor module, which offers possibilities to an enhanced impedance matching.

Further objects of the present invention will be apparent from the following description.

According to a first aspect of the present invention a power transistor module is thus provided, which comprises a support plate;

a power transistor chip arranged on the support plate, the power transistor chip comprising an array of blocks connected in parallel, each of which comprising a plurality of transistors connected in parallel;

outer electrical connections for external connection of the transistor chip, the outer electrical connections projecting from the support plate; and inner electrical connections connected between the transistor chip and the outer connections.

At least one block of transistors connected in parallel includes a plurality of connection pads for at least either ones of the gates or the drains of the transistors in the at least one block and at least one of the inner electrical connections comprises a first conductor pattern arranged on a flexible foil, wherein the first conductor pattern is connected between the plurality of connection pads and one of the outer connections.

Preferably, the first conductor pattern comprises an impedance matching network, particularly in the immediate vicinity of the power transistor chip. This network may comprise a plurality of capacitances and/or inductances. Further, at least some of the capacitances and/or inductances may comprise a trimmable, particularly laser trimmable, shunt for trimming the network for the purpose of reducing parameter variations that occur during the fabrication.

The flexible foil is preferably manufactured of an elastic polymer, e.g. a polyimide, and each conductor pattern is formed on at least one surface of the foil, preferably by printing or etching.

According to a further aspect of the present invention a power amplifier is provided comprising a power transistor module of the above-mentioned kind.

It is a further object of the invention to provide a method in the fabrication of the power transistor module.

According to yet an aspect of the present invention a method in the fabrication of a power transistor module is thus provided, comprising the following steps:

(1) providing a support plate;

(2) arranging a power transistor chip on the support plate, the power transistor chip comprising an array of blocks connected in parallel, each of which comprising a plurality of transistors connected in parallel and wherein at least one block of transistors connected in parallel is provided with a plurality of connection pads for at least either ones of the gates or the drains of the transistors in the at least one block;

(3) mounting outer electrical connections for external connection, the outer electrical connections are arranged in a manner so as to project from the support plate; and (4) mounting inner electrical connections, the inner electrical connections being arranged to connect the transistor chip with the outer connections, wherein at least one of the inner electrical connections is provided as a first conductor pattern arranged on a flexible foil, the first conductor pattern being connected between the plurality of connection pads and one of the outer connections.

It is a further object of the invention to provide a power amplifier and a method in the fabrication of such a power amplifier.

According to further aspects of the present invention a power amplifier and a method in the fabrication of a power amplifier, respectively, are thus provided, which include the power transistor module, and the provision thereof, respectively.

An advantage of the present invention is that it provides for power transistor modules and power amplifiers with improved performances.

By using a flexible foil with a metallic pattern in accordance with the present invention one is not limited to solely one connection point per transistor block but it is possible e.g. to realize the connection at several points. This will give enhanced transistor performance, since the width of the access connectors may be reduced, which implies lower parasitic capacitances. The power distribution will become more uniform, since the outermost cells are active.

Yet an advantage of the present invention is that a faster, cheaper and more reliable fabrication method is achieved, in which parameter variations are minimized.

Further features and advantages of the invention will be apparent from the following detailed description of embodiments of the invention.

SHORT DESCRIPTION OF THE DRAWINGS

The invention will be described closer below with reference to the appended drawings, which are only shown in order to illustrate the invention and shall therefore in no regard limit the same.

FIG. 8 shows a detail of a cross-section of a power transistor module in accordance with yet another embodiment of the present invention.

FIG. 9 shows, schematically in cross-section, a power transistor module mounted at a heat sink and electrically connected to a circuit board in accordance with still another embodiment of the invention.

FIG. 10 is a partial enlargement of the cross-section shown in FIG. 9.

PREFERRED EMBODIMENTS

In the following description, for depicting and not limiting purposes, specific details are set forth, such as particular applications, techniques, methods, etc., to provide a thorough understanding of the present invention. It shall, however, be apparent for the man skilled in the art that the invention may be practiced in other embodiments that deviate from these specific details. In other instances, detailed descriptions of well-known methods, devices or circuits are omitted in order not to obscure the description of the present invention with unnecessary details.

Figure 3:
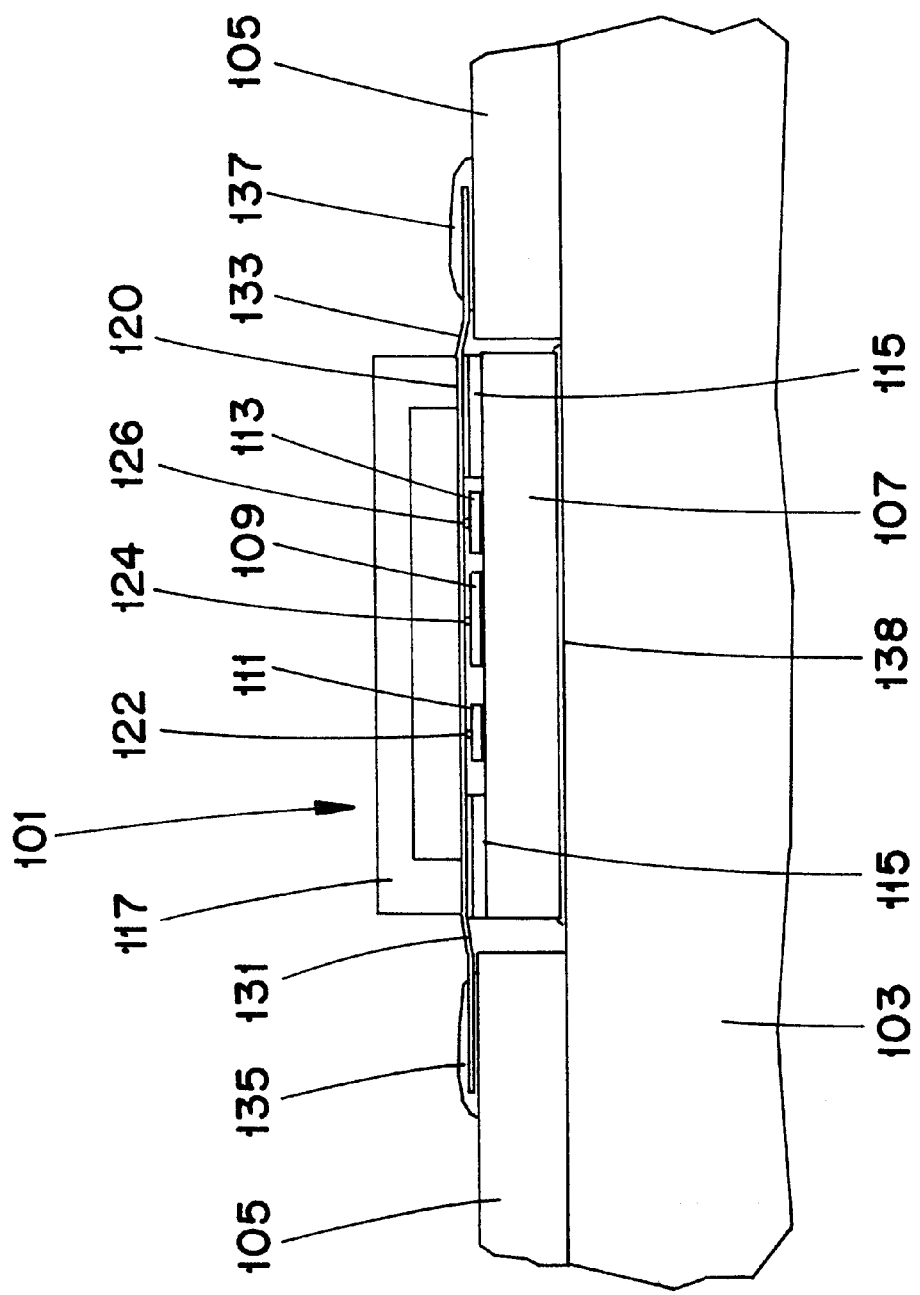
FIG. 3 shows, schematically in cross-section, a power transistor module mounted at a heat sink and electrically connected to a circuit board in accordance with an embodiment of the present invention.

With reference to FIG. 3, which, schematically in cross-section, shows a power transistor module 101 mounted at a heat sink 103 and electrically connected to a circuit board 105, a first embodiment of the present invention will be described.

The inventive power transistor module 101 comprises a substantially rectangular, electrically conductive and heat conductive bottom plate or flange 107, preferably of a metallic material and more preferably of copper, on the upper surface of which a transistor chip 109 and typically a first 111 and a second 113 capacitor chip are mounted. Further, module 101 comprises an insulating wall arrangement or isolator 115 mounted at the upper surface of flange 107 along its edges, such that it surrounds said chip, and a cover 117 attached to isolator 115. Isolator 115 is preferably of a polymeric material and may be manufactured very thin.

The chips are preferably soldered to flange 107, particularly by gold-tin soldering, and the isolator may be glued at flange 107.

Figure 2:
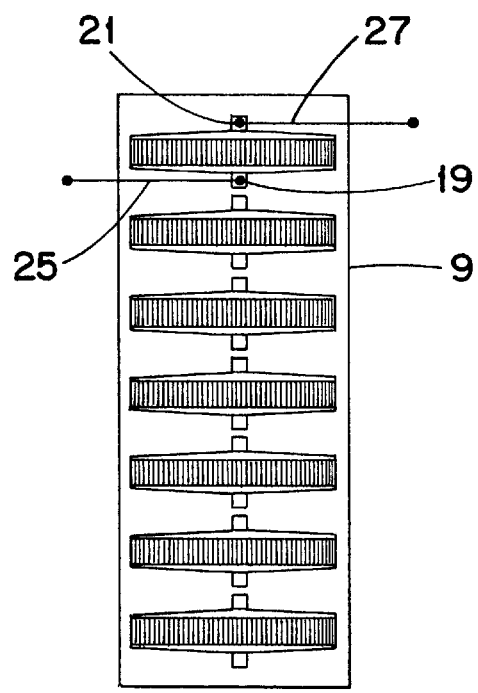
FIG. 2 shows a schematic layout of a transistor chip comprised in the power transistor module of FIG. 1.

The transistor chip 109 is typically an LDMOS chip and comprises a row of blocks connected in parallel, which each comprises a large number of transistor cells connected in parallel, e.g. as is shown in the schematic layout of FIG. 2. The transistor chip delivers an output power of at least a watt and preferably a power from a few watts up to several hundred watts. The transistor chip is intended to operate in the radio frequency region, preferably from a few hundred megahertz up to several gigahertz.

Further, according to the present invention there is an electrical connection, preferably of low inductance, between the transistor chip 109 and electrical circuits arranged on the circuit board. The connection is realized as a flexible and elastic foil, a so-called flexfoil, 120, preferably of a polymeric material, e.g. polyimide, with an electrically conducting pattern arranged thereon. Electrical connection at the transistor chip 109 and at the capacitor chips 111, 113 is realized through thermo-compression bonding using gold bumps 122, 124, 126. Alternatively, the connection is realized through gold-tin soldering.

According to one alternative the chips are firstly mounted at the heat sink and thereafter the flexfoil is mounted at the chips through said bonding or soldering, while another alternative method comprises firstly mounting the chips at the flexfoil, whereafter the chips are mounted at the heat sink, e.g. through gluing or soldering. During the connection between the chips and the flexfoil a self-aligning effect may be achieved, i.e. capillary forces of heated gold bumps may be arranged to "draw" the foil towards the correct position.

In module 101, where the flexible foil 120 is used for the internal connection, the foil 120 projects from module 101, such that it also forms outer connections 131, 133 to circuits occurring on circuit board 105. In this respect, the outer connections 131, 133 of the module 101 are soldered to the surrounding circuits of circuit board 105 through soldered seams 135, 137 simultaneously with other machine soldering occurring at the circuit board. Thereafter module 101 is fastened by screws or bolts to heat sink 103 in a conventional manner (not shown in FIG. 3).

The foil 120 is sufficiently flexible to eliminate (carry) the forces that occur partly during the mounting of module 101, partly due to temperature variations, so that plasticizing and relaxation of the tin in soldered seams 135, 137 are avoided. This means, thus, that module 101 may be mounted at heat sink 103 after soldering of connections 131, 133 and that the lifetime of the soldered seams and thereby of the power transistor module will be considerably prolonged.

The flexible foil 120 may be attached between isolator 115 and cover 117 through gluing. In this respect, the isolator or the cover may comprise recesses for the foil (not shown) but this is not necessary if the thickness of the foil is smaller than the thickness of the glue. The cover consists just as the isolator preferably of a polymeric material, particularly a polymer, which is heat resistant up to at least a temperature of 300° C.

A thermal paste 138 may exist between flange 107 and heat sink 103 to enhance the thermal contact between them.

By using a flexible foil with a conductor pattern instead of bonding wires 23, 25, 27, 29 and connector contacts 31, 33 a number of further advantageous possibilities are achieved, which will be apparent below.

Figure 4:
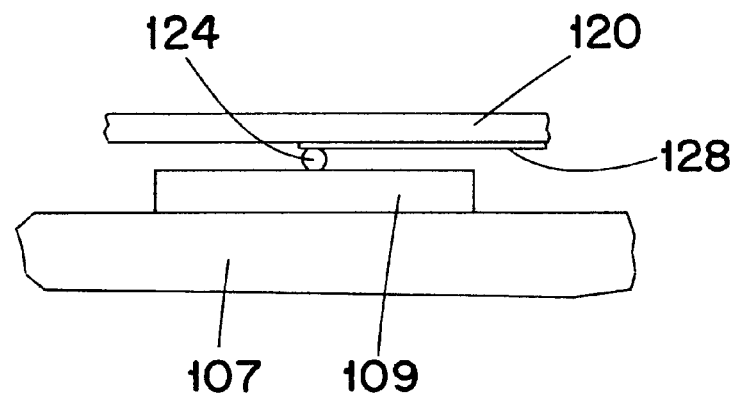
FIG. 4 shows, schematically in cross-section, a partial enlargement of an electrical connection at a transistor chip comprised in the inventive power transistor module of FIG. 3.

With reference now to FIG. 4, a partial enlargement of an electrical connector 128 arranged at the bottom side of foil 120 is schematically shown in cross-section, said electrical connector being e.g. connected to the transistor chip 109 of FIG. 3 through thermal compression bonding using gold bump 124.

Foil 120 consists of an elastic polymer, such as a polyimide. The electrical connector 128 is preferably a metallic conductor pattern, which is printed or etched on foil 120. Alternatively, foil 120 may possibly in its own be of an electrically conductive material.

Figure 5:
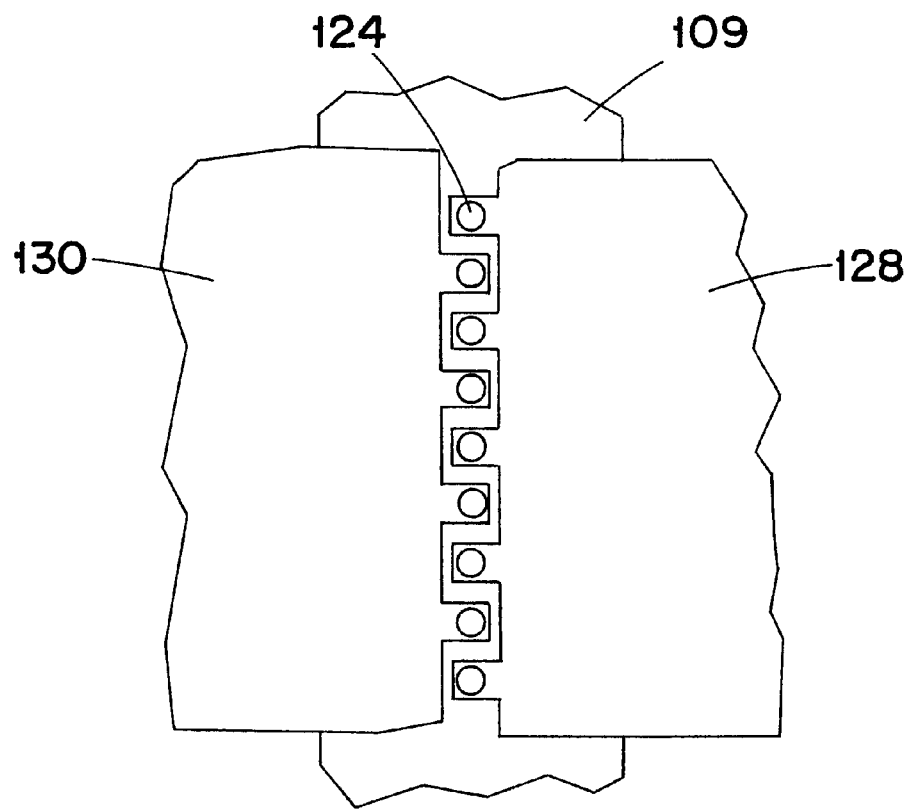
FIG. 5 shows, schematically, a partial enlargement of electrical connections at the transistor chip of FIG. 4, as seen from above.

FIG. 5 shows schematically a partial enlargement of several electrical connections at the transistor chip 109 of FIG. 3 as seen from above. Here is seen a conductor pattern 128, which preferably is connected to the drain connections of transistor chip 109 (one connection for each block of transistor cells), and a conductor pattern 130, which preferably is connected to gate connections of transistor chip 109 (one connection for each block of transistor cells). Note that the conductor patterns 128, 130 are arranged on said above-mentioned flexfoil (not shown in FIG. 5). In the figure, however, gold bump 124 is indicated, which bump provides electrical and mechanical connection between the transistor chip 109 and the conductor pattern through the provision of high temperature and high pressure or through soldering.

By providing wide connectors (much wider than corresponding bonding wires), which further may be connected to each other close to the chip 109, connections of low resistance and low inductance are achieved. Also, the outer connections (131 and 133 of FIG. 3) are preferably comprised of wide connectors.

Figure 6:
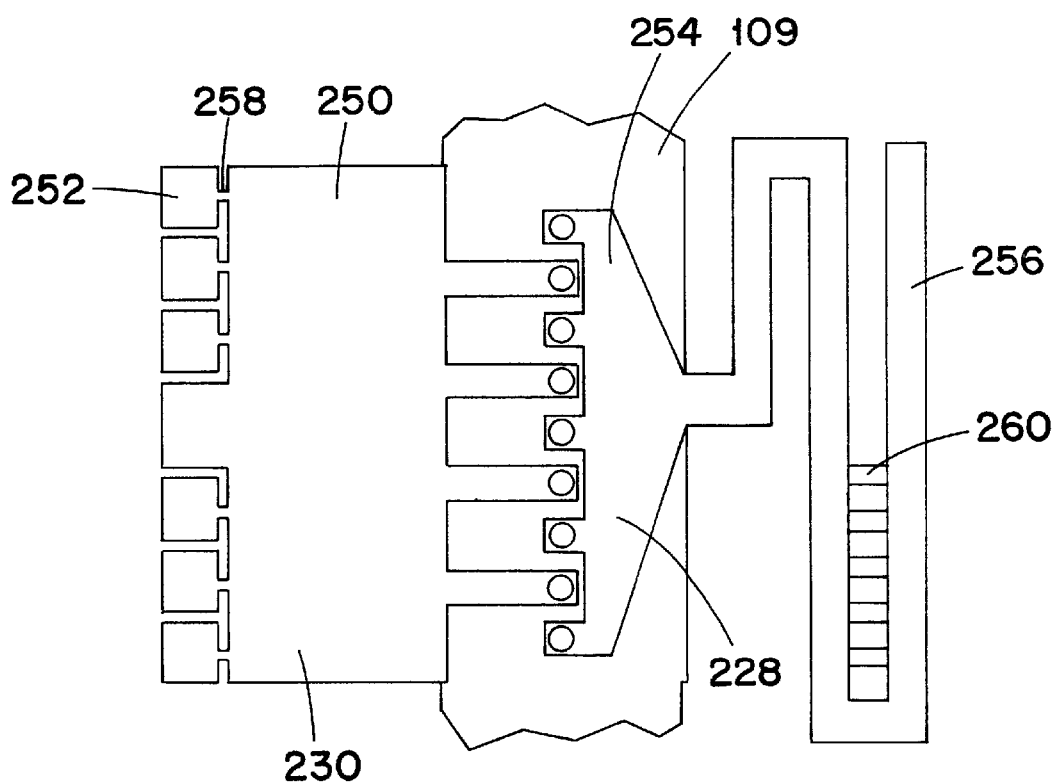
FIG. 6 shows, schematically from above, electrical connections and electrical matching circuits at a transistor chip comprised in a power transistor module in accordance with the present invention.

FIG. 6 shows schematically and seen from above electrical connections to the transistor chip 109 and electrical impedance matching circuits in the immediate vicinity of the transistor chip 109 in accordance with the present invention. A conductor pattern 228 for connection of the drains and a pattern 230 for connection of the gates are shown.

The metallic patterns on the flexible foil may be double-faced and this provides for large possibilities to realize integrated components, such as inductances and capacitances, directly on the foil. These integrated components may constitute part of impedance matching for the power transistor module (both at the input side at 230 and at the output side at 228) and great advantages may be obtained by performing this matching close to the chip 109.

The inductances advantageously comprise parallel inductances or so-called tuning stubs.

Further, the inductances and capacitances may be laser trimmed (if the polymer in the flexfoil resists occurring temperatures; in other instances the polymer may be etched away within selected regions), so that it will be possible to functionally trim components and thereby eliminate, or at least reduce, the parameter variations. It will also become possible to realize different types of feedback with low and controlled phase shifts, such as inverse feedback and balancing out.

In FIG. 6 examples of conductor patterns on a flexible foil with both capacitances 250, 252, 254 and inductances 256 are shown. Further, examples of the above-mentioned trimmable shunts are shown, comprising shunt 258 for capacitance 252 and shunt 260 for inductance 256. It shall be noted that FIG. 6 only illustrates an example. Impedance matching circuits may be considerably more complex and comprise a number of integrated components in a layered structure with an arbitrary number of layers (conductor layers and dielectric layers, respectively).

Figure 7:
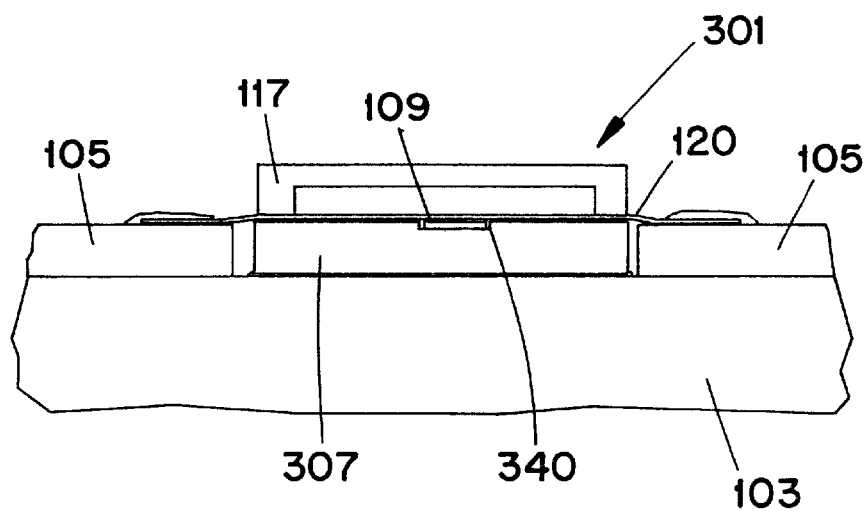
FIG. 7 shows, schematically in cross-section, a power transistor module mounted at a heat sink and electrically connected to a circuit board in accordance with a further embodiment of the present invention.

FIG. 7 shows, schematically in cross-section, a power transistor module 301 mounted at heat sink 103 and electrically connected to circuit board 105 in accordance with a further embodiment of the invention.

It may be possible to realize the complete necessary impedance matching directly onto the foil pattern and a power transistor module may in such a case only need to comprise a transistor chip, a flexible foil 120 and a flange 307. Such a flange 307 may advantageously be provided with a recess 340, which has a good fit to the chip, such that the mounting of the chip is simplified. Recess 340 is laterally positioned for lateral alignment of chip 109 and has a depth, which is substantially the same as the thickness of chip 109, or somewhat deeper. In this respect, also the isolator 107 may be omitted. Preferably, in such a case the conductor pattern is arranged only on the upper side of foil 120 outside chip 109, so that the foil 120 itself constitutes isolation towards the electrically conductive flange 307.

FIG. 8 shows a detail of a cross-section of a power transistor module 401 in accordance with yet a further embodiment of the present invention. Here, an electrically conductive flange 407 is provided with upwardly projecting edges 470, which preferably have an appearance similar to isolator 117 of FIG. 3. Also in this embodiment the conductor pattern is preferably arranged only on the upper side of foil 120 outside chip 109, so that foil 120 itself constitutes isolation towards the electrically conductive flange 307. It shall, however, be appreciated that conductor patterns may exist on the bottom side, if an electrically insulating glue is applied between the conductor pattern and the flange or if electrical contact to the flange is desired.

Figure 1:
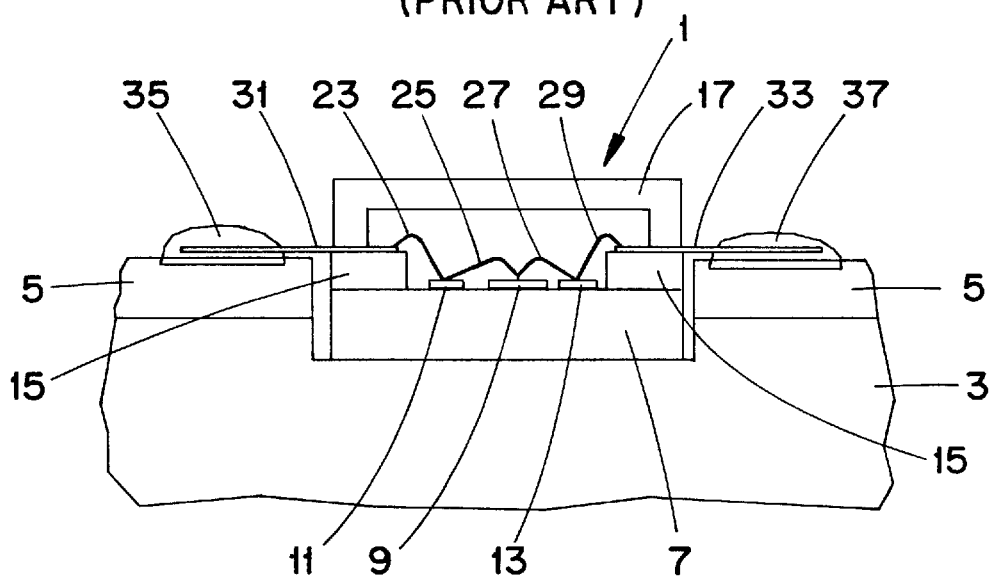
FIG. 1 shows, schematically in cross-section, a power transistor module mounted at a heat sink and electrically connected to a circuit board in accordance with prior art.

In accordance with the present invention the power transistor module preferably has a thickness, which is considerably less than the thickness of a module according to prior art (compare FIGS. 3, 7 and 8 with FIG. 1). The module (excluding the cover) preferably has a thickness in the range of the thickness of circuit board 105. In this respect, no recess in the heat sink is needed.

FIGS. 9 and 10 show, schematically in cross-section, a power transistor module 501 mounted at heat sink 103 and electrically connected to circuit board 105 and a partial enlargement thereof, respectively, in accordance with yet a further embodiment of the invention.

The only difference compared to the embodiment shown in FIG. 3 is that the power transistor module 501 comprises a flexible foil 520, which comprises via holes 536 through foil 520 with the conductor pattern at the soldering position 534 at the circuit board 105.

These via holes 536 serve as venting openings for the solvent gases, which originate from the soldering paste, so that the soldered seam 537 will be free from pores. The via holes will also provide for a better heat conductance through foil 520, such that a repair or enhancement soldering with a soldering bit will be easier to perform.

The transistor chip 109 is typically an LDMOS chip, see FIG. 2, and is comprised of a row of blocks, each of which contains a number of transistor cells connected in parallel. The higher output power that is required, the more blocks must be connected in parallel and this results in unfavorable proportions, since the transistors will become very wide. It has not been possible to increase the number of transistor cells in each block, since it has been difficult to achieve a uniform current distribution among the different transistor cells.

By using a flexible foil with a metallic pattern in accordance with the present invention one is not limited to solely one connection point per transistor block but it is possible e.g. to realize the connection at several points. This will give enhanced transistor performance, since the width of the access connectors may be reduced, which implies lower parasitic capacitances. The power distribution will become more uniform, since the outermost cells are active.

Figure 11A:
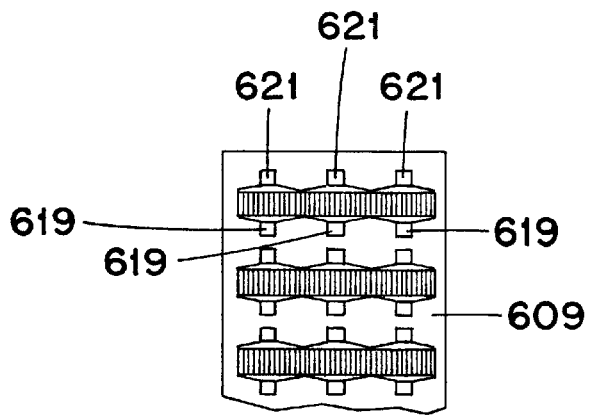
FIGS. 11a and 11b show, schematically seen from above, a part of a layout of a transistor chip and, schematically in cross-section, electrical connections at the transistor chip, said transistor chip being intended to be comprised in a power transistor module in accordance with yet another embodiment of the invention.
Figure 11B:
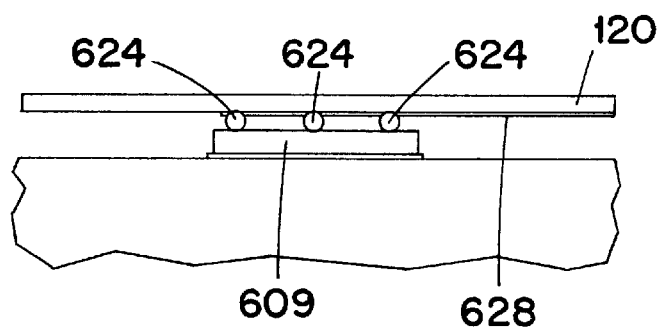

FIGS. 11a and 11b illustrate such an example of three connection points per transistor block in accordance with still a further embodiment of the invention. FIG. 11a shows, schematically seen from above, part of a layout of a transistor chip 609 with three connection pads 619 per transistor block for the gates of the block and with three connection pads 621 per transistor block for its drains. FIG. 11b shows, schematically in cross-section, electrical connections 624 between a conductor pattern 628 arranged on foil 120 and the transistor chip 609.

A further enhancement, which may be achieved by using a flexible foil, is that it is possible to make the complete transistor chip wider, since more connection points may be used.

Figure 12A:
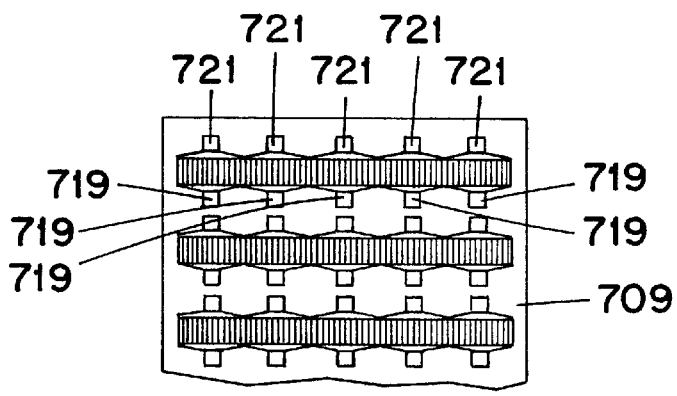
FIGS. 12a and 12b show, schematically seen from above, a part of a layout of a transistor chip and, schematically in cross-section, electrical connections at the transistor chip, said transistor chip being intended to be comprised in a power transistor module in accordance with still another embodiment of the invention.
Figure 12B:
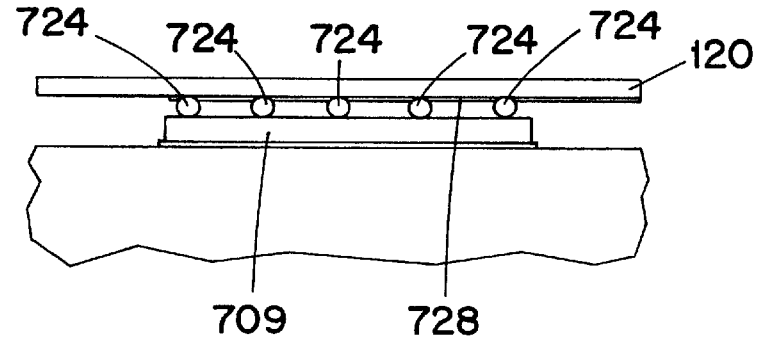

Thus, FIG. 12a shows, schematically seen from above, part of a layout of a transistor chip 709 with five connection points or pads per block (719 indicates the connection pads for the gates of the transistor and 721 indicates the connection pads for its drains). FIG. 12b shows in cross-section five electrical connections 724 per transistor block (between the drains in the upper-most block and a conductor pattern 728 arranged on foil 120), said transistor chip being comprised in a power transistor module in accordance with yet a further embodiment of the invention. Note that the invention allows for connection of power transistor chips having an arbitrary number of connection points per block.

Further, the sources of the transistor cells may be connected on the upper side of the transistor chip (instead of at the bottom side at the heat sink) by e.g. appropriately arranged gold bumps, which connect to conductors arranged on the flexfoil. These conductors preferably comprise a ground plane, e.g. arranged on top of the flexfoil, but can be arranged elsewhere.

It shall, further, be appreciated that the present invention may be utilized for fabrication of power amplifiers or power transistor modules comprising large complex circuits with a plurality of transistor chips, e.g. cascade connected, arranged at a circuit board in solely one module or in a multi module system. In each case a sophisticated multi chip system is achieved, where a flexible foil is utilized for wiring.

Advantages of the present invention comprise i.a. the following:

- The power transistor module may be machine soldered (surface soldered) together with other components on the circuit board, since the flexible foil will resist mechanical stresses during subsequent fastening of the module by screws or bolts to the heat sink.
- By using the flexible and elastic foil with a metallic pattern, such as connector contacts to the circuit board, the problems of alternating repetition of stress of the soldered seams are reduced.
- The thickness of the module may be reduced, which i.a. results in that no recess in the heat sink is needed.
- A considerable reduction of the series inductance (and resistance) may be obtained in comparison with using bonding wires according to prior art.
- There are very good possibilities to perform sophisticated impedance matching inside the power transistor module.
- There are possibilities to design and implement matching networks inside the module and thereby to arrange trimmable inductances and capacitances for the purpose of reducing the parameter variations occurring during fabrication of modules according to the invention.
- Any need of discrete capacitances or mounting blocks inside the transistor module will be reduced.
- It is further provided for optimal possibilities to chip fabrication through better current resistance, reduced risk for metallic migration, lower internal capacitance and wider transistor chips.
- Further, possibilities are obtained to connect the sources of the transistor cells on the upper side of the transistor chip by e.g. appropriately arranged gold bumps, which connect to connectors, particularly in the form of a ground plane arranged on the flexible foil.
- Further, the design and construction of power amplifiers or power transistor modules comprising large complex circuits with a plurality of transistor chips, e.g. cascade coupled, are enabled.

The invention is certainly not limited to the embodiments described above and shown in the drawings but can be modified within the scope of the appended claims. Particularly, the invention is not limited as regards material, geometries, dimensions or fabrication.

What is claimed is:

1. A power transistor module for radio frequency applications, particularly for use in an amplifier stage in a radio base station or in a ground transmitter for TV or radio, said power transistor module comprising:

a support plate;

a power transistor chip arranged on said support plate, said power transistor chip comprising an array of blocks connected in parallel, each of which comprising a plurality of transistors connected in parallel;

outer electrical connections for external connection of said transistor chip, said outer electrical connections projecting from said support plate; and inner electrical connections connected between said transistor chip and said outer connections, wherein at least one block of transistors connected in parallel includes a plurality of connection pads for at least either ones of the gates or the drains of said transistors in said at least one block; and at least one of said inner electrical connections comprises a first conductor pattern arranged on a flexible foil, said first conductor pattern being connected between said plurality of connection pads and one of said outer connections.

2. The power transistor module as claimed in claim 1 wherein the first conductor pattern comprises an impedance matching network, particularly in the immediate vicinity of said power transistor chip.

3. The power transistor module as claimed in claim 2 wherein the impedance matching network comprises capacitances and/or inductances.

4. The power transistor module as claimed in claim 3 wherein at least some of the capacitances and/or inductances comprises a trimmable, particularly laser trimmable, shunt for trimming the impedance matching network for the purpose of reducing parameter variations.

5. The power transistor module as claimed in claim 1 wherein the first conductor pattern is connected to said plurality of connection pads through soldering, particularly gold-tin soldering, or thermo-compression bonding, particularly by using gold bumps.

6. The power transistor module as claimed in claim 1 wherein the first conductor pattern comprises wide conductors in order to achieve a connection to the power transistor chip of low inductance and low resistance.

7. The power transistor module as claimed in claim 1 wherein said power transistor chip is an LDMOS (Lateral Double Diffused Metal Oxide) transistor chip.

8. The power transistor module as claimed in claim 1 wherein each block comprises at least one connection pad for the gates and at least one connection pad for the drains and each of the connection pads for the drains are connected to said first conductor pattern.

9. The power transistor module as claimed in claim 8 wherein each of the connection pads for the gates are connected to a second conductor pattern arranged on said flexible foil.

10. The power transistor module as claimed in claim 9 wherein each block comprises a plurality of connection pads for the drains and a plurality of connection pads for the gates, the plurality of the connection pads for the drains in each block being connected to said first conductor pattern and the plurality of connection pads for the gates in each block being connected to said second conductor pattern.

11. The power transistor module as claimed in claim 1 wherein the support plate comprises an alignment structure, particularly a recess, for alignment of said power transistor chip.

12. The power transistor module as claimed in claim 1 wherein the thickness of the support plate and the thickness of the circuit board are substantially the same.

13. The power transistor module as claimed in claim 1 wherein the flexible foil is of an elastic polymer, e.g. a polyimide, and each conductor pattern is formed on at least one surface of said foil, preferably through printing or etching.

14. The power transistor module as claimed in claim 1 wherein said outer electrical connections comprise a third conductor pattern arranged on the flexible foil.

15. The power transistor module as claimed in claim 14 wherein the flexible foil with the third conductor pattern is machine soldered to a circuit board mounted at a heat sink.

16. The power transistor module as claimed in claim 15 wherein the flexible foil with the third conductor pattern comprises through holes at the soldering place for the machine soldering.

17. The power transistor module as claimed in claim 14 wherein said module is attached to the heat sink by screws or bolts and the flexible foil with the third conductor pattern is sufficiently flexible in order substantially to eliminate stresses in and plasticizing of the soldered seam between the foil with the conductor pattern and the circuit board.

18. The power transistor module as claimed in claim 14 wherein the flexible foil with the third conductor pattern is mechanically attached, particularly through gluing, to the support plate.

19. The power transistor module as claimed in claim 14 wherein the third conductor pattern arranged on the flexible foil comprises wide conductors in order to achieve a connection to the circuit board of low inductance and low resistance.

20. A power amplifier, particularly for use in a radio base station or in a ground transmitter for TV or radio, comprising the power transistor module as claimed in claim 1.

21. A power amplifier, particularly for use in a radio base station or in a ground transmitter for TV or radio, comprising:
  a heat sink;
  a circuit board mounted at said heat sink; and
  a power transistor module comprising a support plate; a power transistor chip arranged on said support plate, the transistor chip including an array of blocks connected in parallel, each of which including a plurality of transistors connected in parallel and a plurality of connection pads for at least either ones of the gates or the drains of the transistors; outer electrical connections projecting from the support plate; and inner electrical connections connected between said transistor chip and said outer connections, one of said inner electrical connections being connected between said plurality of connection pads and one of said outer connections, and said one of said inner electrical connections and said one of said outer connections being comprised of a conductor pattern arranged on a flexible foil; wherein said power transistor module is mounted at said heat sink; and
  said conductor pattern arranged on the flexible foil is electrically connected to said circuit board.

22. The power amplifier as claimed in claim 21 wherein each of said outer electrical connections is comprised of
  a respective conductor pattern arranged on said flexible foil; and
  each of said conductor patterns arranged on said flexible foil and constituting outer electrical connections is electrically connected to said circuit board.

23. The power amplifier as claimed in claim 21 wherein each of said inner electrical connections comprises a respective impedance matching network.

24. A power transistor module for radio frequency applications, particularly for use in an amplifier stage in a radio base station or in a ground transmitter for TV or radio, wherein said power transistor module comprises a support means, a power transistor chip arranged thereon, outer electrical connections projecting from said module for external connection and inner electrical connections connected between said transistor chip and said outer connections, wherein at least one of said inner electrical connections comprises a first conductor pattern arranged on a flexible foil.

25. The power transistor module as claimed in claim 24 wherein the first conductor pattern comprises an impedance matching network, particularly in the immediate vicinity of said power transistor chip.

26. The power transistor module as claimed in claim 25 wherein the impedance matching network comprises capacitances and/or inductances.

27. The power transistor module as claimed in claim 26 wherein at least some of the capacitances and/or inductances comprises a trimmable, particularly laser trimmable, shunt for trimming the impedance matching network for the purpose of reducing parameter variations.

28. The power transistor module as claimed in claim 24 wherein the first conductor pattern is connected to the power transistor chip through soldering, particularly gold-tin soldering, or thermo-compression bonding, particularly by using gold bumps.

* * * * *